US009368471B2

(12) United States Patent
Akiyama et al.

(10) Patent No.: US 9,368,471 B2
(45) Date of Patent: Jun. 14, 2016

(54) WIRE-BONDING APPARATUS AND METHOD OF MANUFACTURING SEMICONDUCTOR DEVICE

(71) Applicant: Shinkawa Ltd., Tokyo (JP)

(72) Inventors: Shinichi Akiyama, Tokyo (JP); Naoki Sekine, Tokyo (JP); Motoki Nakazawa, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/709,761

(22) Filed: May 12, 2015

(65) Prior Publication Data

US 2015/0243627 A1    Aug. 27, 2015

Related U.S. Application Data

(63) Continuation of application No. PCT/JP2013/067592, filed on Jun. 27, 2013.

(30) Foreign Application Priority Data

Nov. 16, 2012    (JP) .................................. 2012-252210

(51) Int. Cl.
*B23K 31/02* (2006.01)
*H01L 23/00* (2006.01)
*H01L 21/66* (2006.01)

(52) U.S. Cl.
CPC ................ *H01L 24/78* (2013.01); *H01L 22/14* (2013.01); *H01L 24/85* (2013.01); *H01L 24/45* (2013.01);

(Continued)

(58) Field of Classification Search
None
See application file for complete search history.

(56) References Cited

U.S. PATENT DOCUMENTS

| 4,213,556 A * | 7/1980 | Persson ................... H01L 24/78 228/104 |
| 4,422,568 A | 12/1983 | Elles et al. |

(Continued)

FOREIGN PATENT DOCUMENTS

| DE | 10061691 A1 * | 6/2002 | ........... B23K 20/004 |
| JP | 58-009332 | 1/1983 | |

(Continued)

OTHER PUBLICATIONS

International Search Report dated Sep. 24, 2013, from corresponding International Application No. PCT/JP2013/067592.

*Primary Examiner* — Kiley Stoner
(74) *Attorney, Agent, or Firm* — Katten Muchin Rosenman LLP

(57) ABSTRACT

Provided is a wire-bonding apparatus (10) including: a capillary (28) through which a wire (30) is inserted; a nonsticking determination circuit (36) configured to apply a predetermined electrical signal between a bonding target and the wire (30) in a clamped state and to determine whether or not the wire (30) and the bonding target is sticking as well as whether or not the wire (30) is disconnected based on a response of the application of the predetermined electrical signal; an annular projecting length detection ring (40) disposed coaxially with the capillary (28); and a projecting length determination circuit (38) configured to determine whether or not a projecting length of a wire tail projecting from the tip of the capillary (28) is appropriate based on detection on whether or not power is conductive when a predetermined inspection voltage is applied between the wire (30) and the projecting length detection ring (40) as well as a presence of a discharge spark when a predetermined inspection high voltage is applied between the wire (30) and the projecting length detection ring (40).

9 Claims, 10 Drawing Sheets

(52) U.S. Cl.
CPC ....... *H01L 24/48* (2013.01); *H01L 2224/45015* (2013.01); *H01L 2224/45124* (2013.01); *H01L 2224/45139* (2013.01); *H01L 2224/45144* (2013.01); *H01L 2224/48091* (2013.01); *H01L 2224/48472* (2013.01); *H01L 2224/789* (2013.01); *H01L 2224/7855* (2013.01); *H01L 2224/78301* (2013.01); *H01L 2224/851* (2013.01); *H01L 2224/859* (2013.01); *H01L 2224/85181* (2013.01); *H01L 2224/85186* (2013.01); *H01L 2224/85205* (2013.01); *H01L 2224/85345* (2013.01); *H01L 2224/85801* (2013.01); *H01L 2924/3011* (2013.01)

(56) References Cited

U.S. PATENT DOCUMENTS

| 4,586,642 | A | * | 5/1986 | Dreibelbis | B23K 20/007 228/104 |
|---|---|---|---|---|---|
| 5,302,836 | A | * | 4/1994 | Siu | G01N 21/8806 250/559.05 |
| 5,316,201 | A | * | 5/1994 | Sugiura | B23K 20/005 228/180.5 |
| 5,402,927 | A | * | 4/1995 | Frasch | B23K 20/007 228/180.5 |
| 5,433,369 | A | * | 7/1995 | Okumura | B23K 20/10 228/1.1 |
| 5,645,210 | A | * | 7/1997 | Toner | B23K 20/10 228/1.1 |
| 6,082,657 | A | * | 7/2000 | Chen | B21F 23/00 242/412.2 |
| 2001/0004991 | A1 | * | 6/2001 | Mochida | B23K 20/007 228/103 |
| 2002/0093348 | A1 | * | 7/2002 | Buhler | B23K 20/004 324/696 |
| 2003/0168498 | A1 | * | 9/2003 | Suter | B23K 1/0016 228/256 |
| 2005/0167473 | A1 | | 8/2005 | Mayer et al. | |
| 2011/0000951 | A1 | * | 1/2011 | Qin | B23K 20/007 228/103 |
| 2013/0098877 | A1 | * | 4/2013 | Song | B23K 20/007 219/69.11 |
| 2015/0162299 | A1 | * | 6/2015 | Keller | H01L 22/26 228/102 |
| 2015/0200143 | A1 | * | 7/2015 | Gillotti | B23K 20/004 228/104 |

FOREIGN PATENT DOCUMENTS

| JP | 58034938 | A | * | 3/1983 | |
| JP | 2817314 | | | 10/1991 | |
| JP | 3335043 | | | 10/1996 | |
| JP | 10-056034 | | | 2/1998 | |
| JP | 2000-306940 | | | 11/2000 | |
| JP | 3192761 | B2 | * | 7/2001 | ............... H01L 24/78 |
| JP | 3201371 | B2 | * | 8/2001 | ............... H01L 24/48 |
| JP | 2005-332850 | | | 12/2005 | |
| JP | 2012-023080 | | | 2/2012 | |
| JP | 5426000 | B2 | * | 2/2014 | ............... H01L 24/78 |

* cited by examiner

WIRE-BONDING APPARATUS AND METHOD OF MANUFACTURING SEMICONDUCTOR DEVICE

TECHNICAL FIELD

The present invention relates to a wire-bonding apparatus capable of performing wire bonding using a capillary, and a method of manufacturing a semiconductor device.

BACKGROUND ART

A wire-bonding apparatus is used for connecting between a lead of a substrate and a pad of a chip with a fine wire, for example. The wire bonding is performed in the following manner. Specifically, a wire along with a tool for wire bonding is caused to move down toward a lead. The wire and the tool are first moved down at high speed, and then slowed down when they come closer to the lead. The low-speed lowering at this time is referred to as first searching (1'st searching). Then, the wire is pressed against the lead by a tip of the tool, and the wire and the lead are bonded while ultrasonic vibration is applied. This bonding is referred to as first bonding (1'st bonding). After the first bonding, the tool is moved upward to feed the wire and moved above a pad while forming an appropriate loop. When the tool comes above the pad, the tool is moved down. The wire is first moved down at high speed, and then slowed down when it comes closer to the pad. The low-speed lowering at this time is referred to as second searching (2'nd searching). Then, the wire is pressed against the pad by the tip of the tool, and second bonding (2'nd bonding) is performed by bonding the wire and the pad while ultrasonic vibration is applied. After the second bonding, the tool is moved upward while the movement of the wire is stopped by a wire clamper to cause the wire to be disconnected at the second bonding point. Repeating this, a plurality of leads of a substrate and of a plurality of pads of a chip are connected. Note that, heating may be performed appropriately during the first bonding and the second bonding. Moreover, the first bonding may be performed to the pads, and the second bonding may be performed to the leads.

As described above, in the wire bonding, two bonding including the first bonding and the second bonding are performed. Unfortunately, however, there is a case in which the first bonding or the second bonding is not normally performed. Further, there may be a case in which, as the first bonding is insufficient, the wire is separated from the lead at the stage of the loop formation before the second bonding. There may also be a case in which the wire is disconnected in the middle of the loop formation even if the first bonding has been normally performed. These phenomena are collectively referred to as nonsticking, and detection of such nonsticking is required to be performed at an early stage. In order to detect nonsticking, a voltage or a current is applied between a side of the substrate and a side of the wire of the tool, and nonsticking is determined based on whether or not a resistance component, a diode component, and a capacitance component between these sides are normal (e.g., PTLs 1 and 2).

Known methods of wire bonding include a ball bonding method and a wedge bonding method.

In the ball bonding method, a gold wire or the like with which a FAB (Free Air Ball) may be formed by high-voltage spark or the like is used, and a capillary having a chamfer portion rotationally symmetric about an axis along a longitudinal direction at its tip is used as a tool. Here, in order to make the FAB to be a directionless spherical shape regardless of a direction in which a tip of the wire faces, it is proposed to use a high-voltage discharge electrode in a ring shape so as to encircle the tip of the wire (e.g., PTL 3).

In the wedge bonding method, an aluminum wire or the like is used and any FAB is formed, and a tool for wedge bonding having a wire feed guide and a pressing surface at its tip is used as a tool for bonding instead of a capillary. In the wedge bonding, at the tip of the tool, the wire is fed along the wire feed guide at an angle on a side of the pressing surface, and a side surface of the wire is pressed against a bonding target with the pressing surface so as to perform bonding. Therefore, the wire projects laterally from the pressing surface by the tip of the tool, and the tip of the tool is not rotationally symmetric about the axis along a longitudinal direction (e.g., PTL 4).

As the tip of the tool for wedge bonding is not rotationally symmetric, there is a case in which a direction of the wire feed guide may not be aligned with a direction of connection of the wire as it is depending on the arrangement of the pads and the leads. Accordingly, a bonding head that holds the tool is configured as a rotary type (e.g., PTL 5), or a bonding stage that holds the bonding target is rotated. Thus, there is proposed a method of using a capillary having a rotationally symmetric tip, and of pressing the side of the wire with the tip of the capillary to perform bonding (e.g., PTL 6).

CITATION LIST

Patent Literatures

PTL 1: Japanese Patent No. 3335043
PTL 2: Japanese Unexamined Patent Application Publication No. 2000-306940
PTL 3: Japanese Patent No. 2817314
PTL 4: Japanese Unexamined Patent Application Publication No. S58-9332
PTL 5: Japanese Unexamined Patent Application Publication No. S55-7415
PTL 6: US Patent Application Publication No. 2005/0167473

SUMMARY OF INVENTION

Technical Problems

In the wedge bonding method, an aluminum wire whose stretching property is smaller than that of a gold wire. Therefore, in a case in which wire bonding at a first bonding point is normally, wire bonding at a second bonding point performed subsequently is insufficient and makes a wire nonsticking, and then wire disconnection is performed while the wire is clamped, the wire can be possibly disconnected at a loop between the first bonding point and the second bonding point.

It is possible to determine whether or not a wire is nonsticking or disconnected based on a response of an application of an electrical signal applied between a bonding target and the wire. However, considering a case in which the wire is disconnected at a loop between the first bonding point and the second bonding point before determining whether or not the wire is nonsticking in the wire bonding at the second bonding point, this case is the same as the case in which the wire bonding at the second bonding point is normally performed and the wire is disconnected normally at the second bonding point in that power is not conducting between the bonding target and the wire. Therefore, by making the determination on whether or not the wire is nonsticking or disconnected after the bonding at the second bonding point, the case in which the bonding at the second bonding point ends up nonsticking and the wire is disconnected at a loop between the first bonding point and the second bonding point shall be erroneously determined to be the case in which the bonding at the second bonding is normal and the wire is disconnected normally.

When the bonding at the second bonding point ends up nonsticking and the wire is disconnected at a loop between the first bonding point and the second bonding point, a long wire projects from a tip of a tool for bonding. If this state is erroneously determined to be the case in which the wire bonding at the second bonding point normal, the next bonding is going to be performed in this state without any change. In other words, wire bonding at a next first bonding point is going to be performed in a state in which a long wire projects from the tip of the tool for bonding, and a defective product shall be produced. Thus, making erroneous determination on whether or not the bonding at the second bonding point is normal contributes to defective products.

An object of the present invention is to provide a wire-bonding apparatus and a method of manufacturing a semiconductor device, both capable of making correct determination on whether or not bonding at a second bonding point is normal.

Solution to Problems

A wire-bonding apparatus according to the present invention includes: a capillary through which a wire is inserted; an annular wire projecting length detection ring disposed coaxially with the capillary; and a projecting length determination unit configured to determine whether or not a projecting length of the wire projecting from the tip of the capillary is appropriate based on detection on whether or not power is conductive when a predetermined inspection voltage is applied between the wire and the wire projecting length detection ring.

Further, it is preferable that the wire-bonding apparatus according to the present invention be configured such that a predetermined inspection high voltage is applied between the wire and the wire projecting length detection ring to detect a presence of a discharge spark, if the power has been detected to be non-conductive when the predetermined inspection voltage is applied between the wire and the wire projecting length detection ring.

It is also preferable that the wire-bonding apparatus according to the present invention be configured such that the projecting length determination unit: previously obtains a relation regarding detection among the projecting length of the wire, the inspection high voltage, and the presence of a spark; sets the inspection high voltage according to a bonding condition for wire bonding; and determines whether or not the projecting length of the wire is suitable for the bonding condition.

It is also preferable that the wire-bonding apparatus according to the present invention further includes: a disconnection determination unit configured to apply a predetermined electrical signal and to determine whether or not the wire is disconnected based on a response of the application of the predetermined electrical signal, the predetermined electrical signal being applied between a bonding target and the wire in a clamped state after an operation of disconnecting the wire from a second bonding point is performed by moving the capillary while the wire is in the clamped state after wire bonding at the second bonding point is performed subsequent to wire bonding at a first bonding point, and is configured such that when the disconnection determination unit has determined that the wire is disconnected, the projecting length determination unit determines whether or not the projecting length of the wire is appropriate, and when the projecting length of the wire has been determined to be inappropriate, outputs an abnormal signal determining that bonding at the first bonding point has not been performed and that the wire has been disconnected between the first bonding point and the second bonding point.

It is also preferable that the wire-bonding apparatus according to the present invention further includes: a preliminary bonding unit configured to, when the projecting length of the wire has been determined to be inappropriate, make a disconnected tip portion of the wire be an appropriate projecting length using a previously determined preliminary bonding point.

It is also preferable that the wire-bonding apparatus according to the present invention be configured such that the wire bonding at the first bonding point and the second bonding point is performed according to a wedge bonding method.

In addition, a method of manufacturing a semiconductor device according to the present invention includes: a first wire bonding step of bonding a wire to a first bonding target at a first bonding point of wire bonding using a capillary through which the wire is inserted, the bonding being performed according to a wedge bonding method; a second wire bonding step of feeding the wire by a predetermined wire length from the first bonding point after the wire bonding at the first bonding point, and bonding the wire to a second bonding target at a second bonding point of the wire bonding; a movement step of, after the wire bonding at the second bonding point, moving the capillary through which the wire is inserted while the wire is clamped to disconnect the wire from the second bonding point; a disconnection determination step of applying a predetermined electrical signal between the second bonding target and the wire after the capillary has been moved to disconnect the wire, and determining whether or not the wire is disconnected based on a response of the application of the predetermined electrical signal; a projecting length determination step of determining whether or not the projecting length of the wire projecting from the tip of the capillary is appropriate when the wire has been determined to be disconnected, the determination being made based on detection on whether or not power is conductive when a predetermined inspection voltage is applied between the wire and an annular wire projecting length detection ring disposed coaxially with the capillary; and an output step of, when the projecting length of the wire has been determined to be inappropriate, outputting an abnormal signal determining that bonding at the second bonding point has not been performed and that the wire has been disconnected between the first bonding point and the second bonding point.

It is also preferable that the method of manufacturing a semiconductor device according to the present invention a predetermined inspection high voltage is applied between the wire and the wire projecting length detection ring to detect a presence of a discharge spark, if the power has been detected to be non-conductive when the predetermined inspection voltage is applied between the wire and the wire projecting length detection ring.

It is also preferable that the method of manufacturing a semiconductor device according to the present invention further include a preliminary bonding step of making a disconnected tip portion of the wire be an appropriate projecting length using a previously determined preliminary bonding point when the projecting length of the wire has been determined to be inappropriate.

Advantageous Effects of Invention

According to a wire-bonding apparatus and a method of manufacturing a semiconductor device of the present invention, it is possible to make correct determination on whether or not bonding at a second bonding point is normal.

DESCRIPTION OF EMBODIMENT

Figure 1:
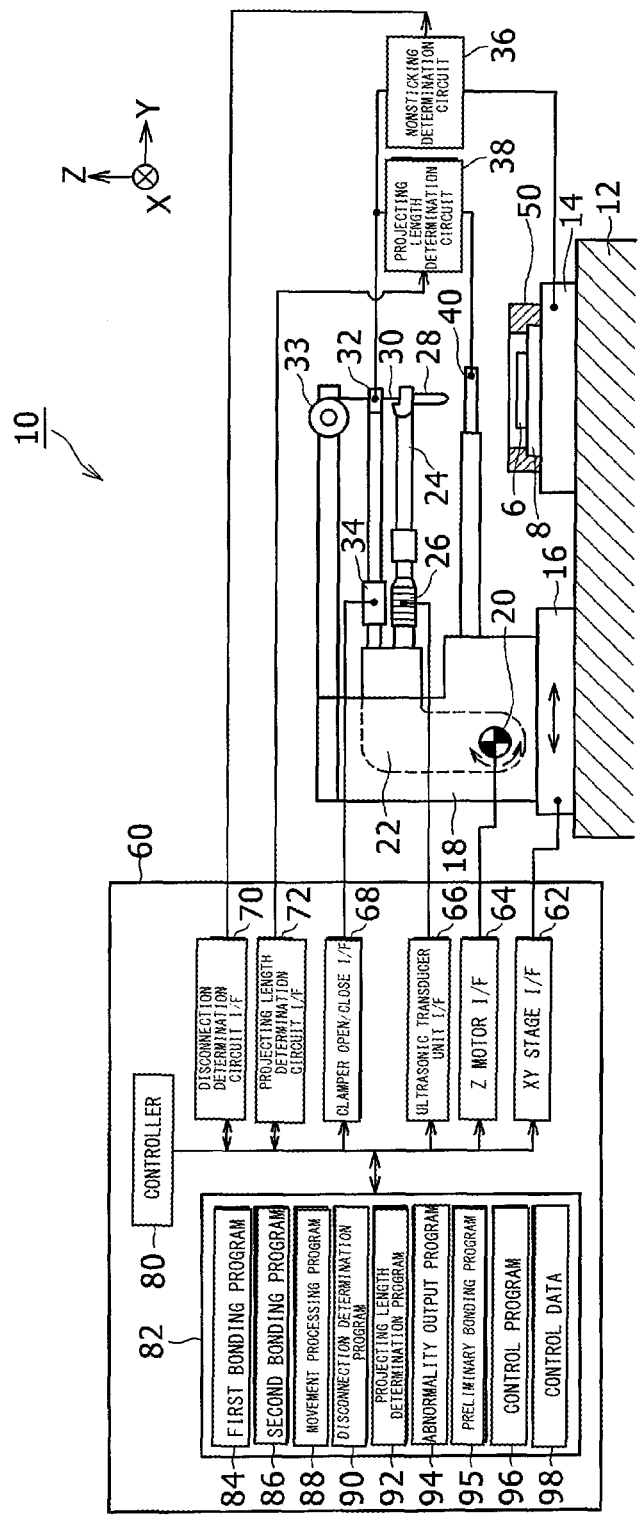
FIG. 1 is a configuration diagram of a wire-bonding apparatus according to an embodiment of the present invention.

Hereinafter, an embodiment according to the present invention will be described with reference to the drawings. In the following description, as target objects of wire bonding, a lead of a circuit board is taken as a first bonding point, and a pad of a chip is taken as a second bonding point. However, this is exemplification for explanation, and the first bonding point can be a pad of the chip, and the second bonding point can be a lead of the circuit board. Both of the first bonding point and the second bonding point can be pads of the chip, or both of the first bonding point and the second bonding point can be leads of the circuit board. The pads and the leads are examples of a target object to which the wire is bonded, and the target object can take a different form. Further, examples of the target object of bonding include, in addition to the chip, a general electronic component such as a resistor chip or a capacitor chip, and the circuit board can be an epoxy resin substrate or the like, or a lead frame or the like.

Dimensions and materials described below are exemplification for explanation, and can be altered appropriately according to specification of a wire-bonding apparatus.

In the following description, a single component and its corresponding components are denoted by the same reference numeral throughout the drawings, and repetitive descriptions shall be omitted.

FIG. 1 is a configuration diagram of a wire-bonding apparatus 10. The wire-bonding apparatus 10 employs a capillary 28 as a tool for wire bonding and an aluminum wire as a wire 30, and connects two bonding targets with the wire 30 according to a wedge bonding method. In FIG. 1, a chip 6 and a circuit board 8 as the bonding targets are illustrated, although these are not included in the components of the wire-bonding apparatus 10. Note that, as used herein according to the embodiment of the present invention, the wedge bonding method refers to a bonding method that performs bonding using ultrasonic waves or a pressure without forming an FAB at a tip of the wire.

The wire-bonding apparatus 10 is configured including a bonding stage 14 held on a mount 12, an XY stage 16, and a computer 60.

The bonding stage 14 is a bonding target supporting stage on which the chip 6 and the circuit board 8 as the two bonding targets are placed. The bonding stage 14 is movable with respect to the mount 12 when the circuit board 8 or the like are placed or discharged, but not movable with respect to the mount 12 during bonding. As the bonding stage 14, a metallic moving table can be used. The bonding stage 14 is connected to a reference potential, such as a ground potential of the wire-bonding apparatus 10. The bonding stage 14 is connected to a grounding terminal of a nonsticking determination circuit 36 that will be later described. If the bonding stage 14 is required to be insulated from the chip 6 or the circuit board 8, an insulation treatment is applied to a portion of the bonding stage 14 that is required to be insulated.

The chip 6 is an electronic circuit in which a silicon substrate and a transistor and the like are integrated. As an electronic circuit, input terminals, output terminals, and the like are pulled out as a plurality of pads (not depicted) on an upper surface of the chip 6. A lower surface of the chip 6 is a back surface of the silicon substrate, and constituted as a grounding electrode of the electronic circuit.

The circuit board 8 is configured such that a desired wiring is patterned on an epoxy resin substrate, and includes a chip pad (not depicted) that electrically and mechanically connects and fixes the lower surface of the chip 6, a plurality of leads (not depicted) disposed around the chip pad, and the input terminals and the output terminals of the circuit board pulled out from the chip pad and the plurality of leads. Wire bonding is performed by connecting the pads of the chip 6 and the leads of the circuit board 8 with the wire 30.

A lead clamper 50 provided for the bonding stage 14 is a flat-plate member having an opening in its center and supports the circuit board 8. The lead clamper 50 fixes the circuit board 8 to the bonding stage 14 by holding the circuit board 8 around a peripheral edge of the opening, while the lead of the circuit board 8 and the chip 6 to be connected by wire bonding are positioned in the opening in the center.

As will be described later, when the wire 30 is disconnected with an inappropriate projecting length, preliminary bonding is performed for the next step.

The XY stage 16 is a moving table provided with a bonding head 18, and configured to move the bonding head 18 to a desired position in an XY plane with respect to the mount 12 and the bonding stage 14. The XY plane is a plane parallel to an upper surface of the mount 12. A Y direction is parallel to a longitudinal direction of an ultrasonic transducer 24 attached to a bonding arm (not depicted) that will be later described. FIG. 1 shows an X direction and the Y direction, as well as a Z direction that is perpendicular to the XY plane.

The bonding head 18 is fixed to and provided for the XY stage 16. The bonding head 18 is a moving mechanism including a Z motor 20, and configured to move the capillary 28 in the Z direction, by controlling rotation of this motor, through a Z-drive arm 22 and the ultrasonic transducer 24. As the Z motor 20, a linear motor can be used.

To the Z-drive arm 22, the ultrasonic transducer 24 and a wire clamper 32 are attached. The Z-drive arm 22 is a member that is rotatable about a rotation center provided for the bonding head 18 by controlling rotation of the Z motor 20. The rotation center provided for the bonding head 18 is not necessarily an output axis of the Z motor 20, and is set at a position where a rotational load is reduced considering a position of a gravity center as a whole including the Z-drive arm 22, the ultrasonic transducer 24, and the wire clamper 32.

The ultrasonic transducer 24 is an elongated stick-like member configured such that a base portion of the ultrasonic transducer 24 is attached to the Z-drive arm 22, and the capillary 28 through which the wire 30 is inserted is attached to a tip portion of the ultrasonic transducer 24. To the ultrasonic transducer 24, the ultrasonic transducer unit 26 is attached, and the ultrasonic transducer 24 transmits ultrasonic energy produced by driving an ultrasonic transducer unit 26 to the capillary 28. Therefore, the ultrasonic transducer 24 is configured in a horned shape that is tapered to the tip so that ultrasonic energy from the ultrasonic transducer unit 26 can be efficiently transmitted to the capillary 28. As the ultrasonic transducer unit 26, a piezoelectric device can be used.

The capillary 28 is a bonding tool in a conical body with a flat tip surface and having a through hole in its center through which the wire 30 can be inserted along its longitudinal direction. As the capillary 28, a ceramic capillary used in ball bonding can be used as it is. The capillary used in ball bonding has a corner portion in an appropriate shape called chamfer on a side of the tip surface in the through hole so as to be able to easily hold an FAB. In the wedge bonding method according to this embodiment, the capillary for ball bonding is used. The capillary has a flat surface called a face at a lower surface on the side of the tip surface in the through hole of this capillary. The face constitutes a pressing surface when wedge bonding is performed by the wire-bonding apparatus 10.

At a tip portion of a tool for wedge bonding, a wire feed guide inclined with respect to its longitudinal direction and a pressing surface for pressing a side surface of the wire are provided. Therefore, the wire projects laterally in a direction along the direction of the wire feed guide, instead of in a manner rotationally symmetric about an axis along the longitudinal direction of the tool. If such a tool for wedge bonding is used, there is a case in which the direction of the wire feed guide does not match the direction in which the wire is to be bonded depending on positions of the leads and the pads.

For example, if the chip 6 is mounted at a central portion of the circuit board 8, the plurality of pads are arranged along a peripheral end of the chip 6, and the plurality of leads are provided for the circuit board 8 so as to encircle around the chip 6, the connecting direction of the wire between a lead and a pad varies each time when wire bonding is performed a plurality of times. In order to align the direction of the wire feed guide with the connecting direction of the wire, it is necessary either to cause the tool for wedge bonding to be rotate around the axis along the longitudinal direction, or to rotate the circuit board 8.

By contrast, as the face of the capillary 28 on the side of the tip surface is rotationally symmetrical about the axis of the capillary 28 along the longitudinal direction, even if the connecting direction of the wire between a lead and a pad varies each time of wire bonding, it is sufficient to perform a shaping operation for slightly changing the direction of the wire 30 projecting from the tip of the capillary 28. Accordingly, the capillary 28 is used in wedge bonding.

The wire 30 inserted through the capillary 28 is an aluminum fine wire. The wire 30 is wound around a wire spool 33 provided at a tip of a wire holder extending from the bonding head 18, and inserted into the through hole in the center of the capillary 28 from the wire spool 33 via the wire clamper 32. The wire 30 then projects from the tip of the capillary 28. Examples of a material of the wire 30 include a fine wire in which silicon, magnesium, and such are appropriately mixed, in addition to a pure aluminum fine wire. A diameter of the wire 30 can be selected depending on the bonding target. One example of the diameter of the wire 30 is 30 μm.

The wire clamper 32 is a wire clamping device attached to the Z-drive arm 22, and having a pair of clamping plates respectively disposed on the both sides of the wire 30. The wire clamper 32 is configured to cause the wire 30 to be in a freely movable state by opening the facing clamping plates, and cause the wire 30 to be not movable by closing the facing clamping plates. As being attached to the Z-drive arm 22, the wire clamper 32 is able to appropriately clamp the wire 30 even when the capillary 28 moves in any direction in X, Y, or Z. Opening/closing of the wire clamper 32 is performed by activating a clamper opening/closing unit 34 employing a piezoelectric device.

The nonsticking determination circuit 36 is a circuit that determines whether or not connection between the bonding target and the wire 30 is appropriate at every step of wire bonding. The nonsticking determination circuit 36 applies a predetermined electrical signal between the bonding target and the wire 30, and determines whether or not the connection between the bonding target and the wire 30 is appropriate based on a response of the application.

In a case in which the wire 30 connects the lead of the circuit board 8 and the pad of the chip 6, taking the lead of the circuit board 8 as the first bonding point, and the pad of the chip 6 as the second bonding point, steps of wire bonding include: a first wire bonding step in which the wire 30 is connected to the first bonding point; a loop formation step in which the wire 30 is fed from the first bonding point to the second bonding point to form a loop; a second wire bonding step in which the wire 30 is connected to the second bonding point; and a movement step in which the capillary 28 is moved in order to disconnect the wire 30 at the second bonding point after the second wire bonding.

The nonsticking determination circuit 36 is a circuit that determines, at timing corresponding to the respective steps, whether or not the wire 30 is bonded to the lead at the first bonding point, whether or not the wire 30 is bonded to the pad at the second bonding point, and whether or not the wire 30 is disconnected at the second bonding point.

Here, in particular, the nonsticking determination circuit 36 determines whether or not the wire 30 is disconnected at the second bonding point after the second wire bonding. In this context, the nonsticking determination circuit 36 can be referred to as a disconnection determination circuit.

Figure 2:
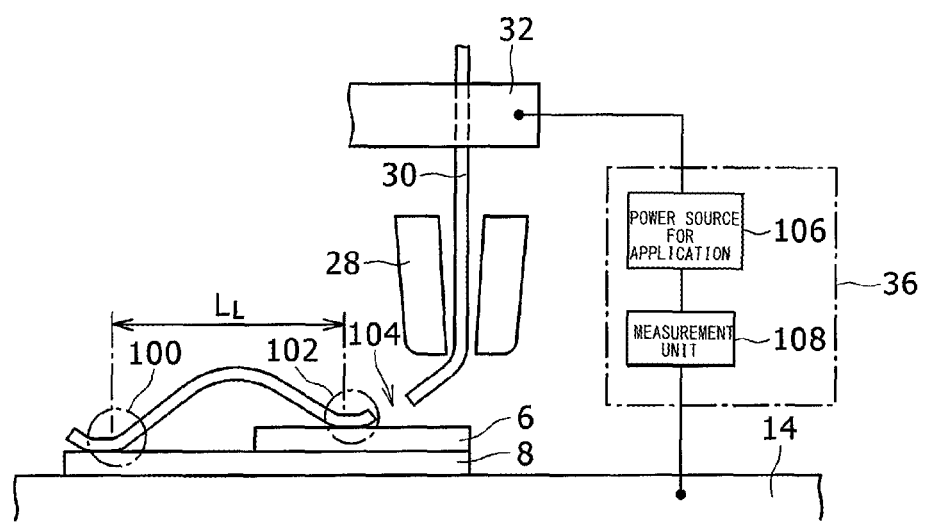
FIG. 2 is a diagram illustrating a disconnection determination circuit of the wire-bonding apparatus according to the embodiment of the present invention.

FIG. 2 is a diagram illustrating the nonsticking determination circuit 36 when functioning as a disconnection determination circuit. FIG. 2 shows that the wire 30 is in a disconnected state 104 at a second bonding point 102 after determining that wire bonding is appropriately performed at a first bonding point 100 in the first wire bonding step, going through the loop formation step of the wire 30, moving to the second wire bonding step to determine that wire bonding is appropriately performed at the second bonding point 102 in the second wire bonding step, and then moving the capillary 28 in the movement step.

The nonsticking determination circuit 36 is configured by an application power source 106 and a measurement unit 108, and having one terminal connected to the bonding stage 14 and the other terminal connected to either the wire clamper 32 or the wire spool 33. Taking the application power source 106 as a direct voltage power supply, it is possible to learn a resistance component between the wire 30 and the bonding stage 14 by measuring an impedance value using an undepicted impedance measuring circuit within the measurement unit 108. Taking the application power source 106 as an alternate voltage power supply, it is possible to learn a capacitance component between the wire 30 and the bonding stage 14 by measuring an impedance value using the impedance measuring circuit within the measurement unit 108.

In wire bonding, an inspection of sticking and nonsticking by a direct or an alternate current differs depending on the device to be a target and differs between pads even in the same device. When a direct voltage power supply is applied, if the wire 30 is in the connected state (sticking state) with the pad of the chip 6, the resistance component takes a finite value. When an alternate voltage power supply is applied, there is a large difference in a capacitance component between cases in which the wire 30 is in the connected state (sticking state) with the pad of the chip 6 and in an unconnected state (nonsticking state) with the pad of the chip 6. When an alternate voltage power supply is applied, and the wire 30 is in the connected state (sticking state) with the pad of the chip 6, the capacitance component is larger than that in the unconnected state (nonsticking state). In contrast, when applying the direct voltage power supply, and the wire 30 is in the disconnected state 104, the resistance component is an infinity as a state between the wire 30 and the bonding stage 14 is electrically open. Further, when applying the alternate voltage power supply, and the wire 30 is in the disconnected state (nonsticking state) with the pad of the chip 6, the capacitance component is smaller than that in the connected state (sticking state). In this manner, based on changes of the resistance component and the capacitance component in the measurement unit 108, the nonsticking determination circuit 36 determines whether the state between the wire 30 and the bonding stage 14 is in the connected state or in the open state. With this, it is possible to determine whether or not the wire 30 is in the disconnected state 104.

A projecting length determination circuit 38 and a projecting length detection ring 40 are provided in order to determine whether or not wire bonding at the second bonding point 102 is normal and the wire 30 is disconnected at the second bonding point 102 as described with reference to FIG. 2, when the wire 30 is determined to be in the disconnected state in the nonsticking determination circuit 36.

This is because, as the state between the wire 30 and the bonding stage 14 is open even when the second wire bonding is inappropriate and the wire 30 is in the nonsticking state at the second bonding point 102 and the wire 30 is disconnected between the first bonding point 100 and the second bonding point 102, the nonsticking determination circuit 36 can possibly determines erroneously that the wire 30 is in the sticking state and disconnected at the second bonding point 102.

Figure 3:
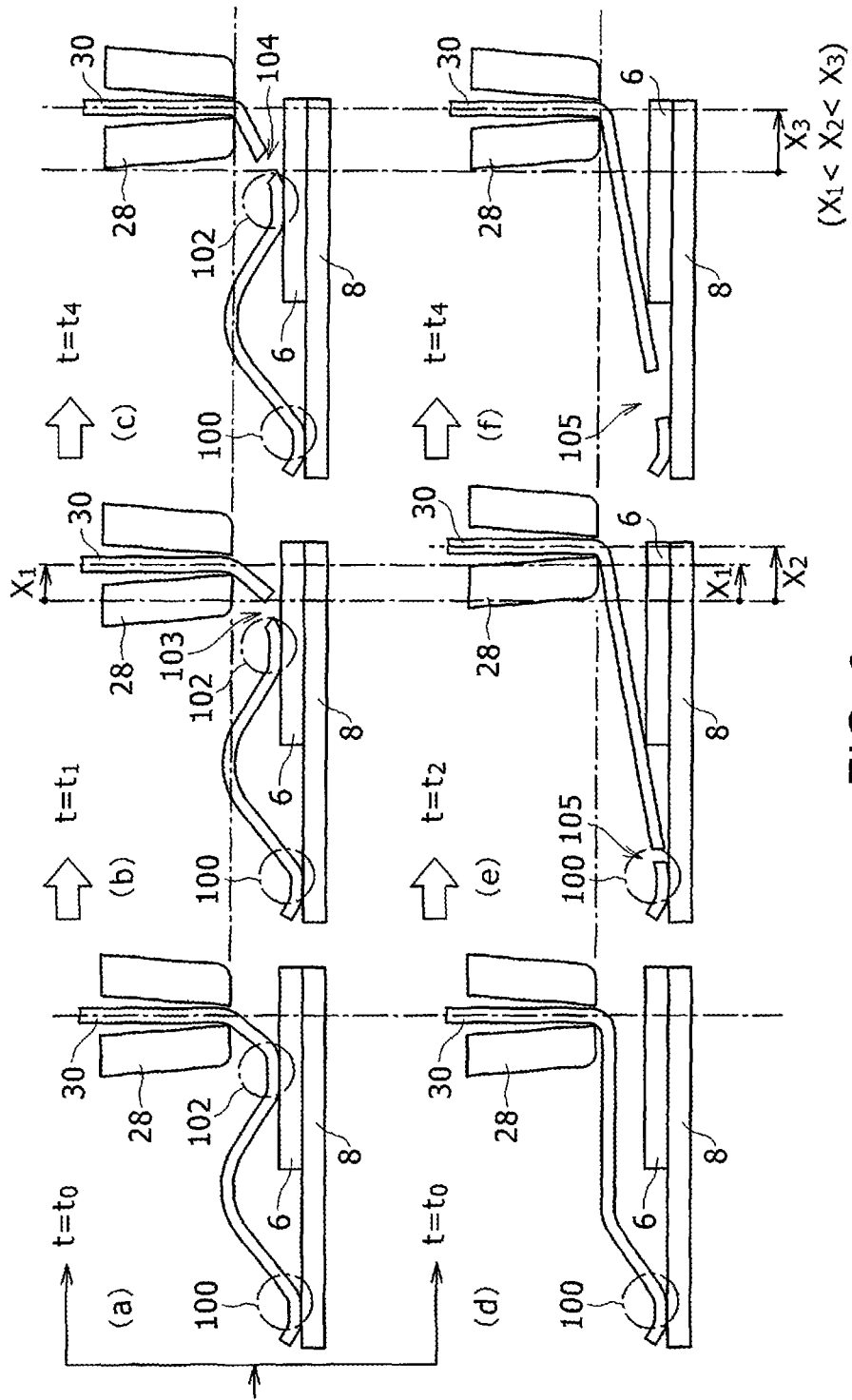
FIG. 3 illustrates a case in which erroneous determination on whether or not wire bonding at a second bonding point is normal can be made in the wire-bonding apparatus and a wire-bonding method according to the embodiment of the present invention.

This is described with reference to FIG. 3. FIG. 3 illustrates that erroneous determination can be made depending on timing of determination by the nonsticking determination circuit 36 and timing at which the wire is disconnected, if a result from the nonsticking determination circuit 36 is received as it is.

FIGS. 3(a) to 3(c) illustrates a case in which the second wire bonding is performed normally at the second bonding point 102, and the wire 30 is disconnected at the second bonding point 102 normally by the movement for the disconnection.

FIG. 3(a) illustrates a state in which the second wire bonding at the second bonding point 102 is completed at time $t=t_0$, and the capillary 28 is slightly moved upward to a +Z direction. Here, the second wire bonding is performed normally, and the wire 30 is normally bonded to the pad of the chip 6 at the second bonding point 102. FIG. 3(b) illustrates a state in which the capillary 28 makes predetermined movement for disconnecting the wire within the XY plane at time $t=t_1$. As the predetermined movement, the state in which the capillary 28 has moved to a +X direction by $X_1$. At $t=t_1$, the wire 30 is normally brought into a disconnected state 103 at the second bonding point 102. FIG. 3(c) illustrates a state at time $t=t_4$ in which the capillary 28 has further moved to the +X direction by $X_3$.

In this case, the nonsticking for the second bonding point 102 can be determined based on a result of determination by the nonsticking determination circuit 36 at $t=t_0$ and at $t=t_4$. Specifically, when the wire 30 is not disconnected at $t=t_0$, and the wire 30 is in the disconnected state at $t=t_4$, it is determined that the wire 30 is bonded normally at the second bonding point 102, and the wire 30 is disconnected normally at the second bonding point 102. When the wire 30 is not disconnected at $t=t_0$ or at $t=t_4$, it is determined that the wire 30 is in the nonsticking state at the second bonding point 102 and the wire 30 is not disconnected thereafter.

FIGS. 3(d) to 3(f) illustrates a case in which the second wire bonding is inappropriate, the wire 30 is nonsticking without being boned to the pad of the chip 6 at the second bonding point 102, and the wire 30 is disconnected between the first bonding point 100 and the second bonding point 102.

FIG. 3(d) illustrates a state in which the capillary 28 is slightly moved upward to the +Z direction after the second wire bonding similarly to FIG. 3(a). However, the second wire bonding in this case is not performed normally, and the wire 30 is in the nonsticking state without being bonded to the pad of the chip 6. FIG. 3(e) illustrates a state in which, similarly to the case in which second wire bonding is performed normally, the wire 30 is brought into a disconnected state 105 between the first bonding point 100 and the second bonding point 102 as the capillary 28 has moved to the +X direction by $X_2$. FIG. 3(f) illustrates a state at time $t=t_4$ after the capillary 28 has further moved to the +X direction by $X_3$. In FIG. 3(f), $t_4$ and $X_3$ are the same as those in FIG. 3(c). It should be noted that a relation is expressed as $X_1 < X_2 < X_3$. In the figure, while the wire 30 is nonsticking to the pad at the second bonding point 102, the second bonding point 102 is a point at which the second wire bonding is to be performed.

At this time, making the nonsticking determination for the second bonding point 102 based on the result of the determination by the nonsticking determination circuit 36 at $t=t_0$ and at $t=t_4$ results in erroneous determination. Specifically, the state in which the wire 30 is not disconnected at $t=t_0$ and the wire 30 is in the disconnected state at $t=t_4$ is the same as the normal state described with reference to FIGS. 3(a) to 3(c). Therefore, by making the nonsticking determination for the second bonding point 102 based on the result of the determination by the nonsticking determination circuit 36 at $t=t_0$ and at $t=t_4$, it is not possible to distinguish between the normal case illustrated in FIGS. 3(a) to 3(c) and the nonsticking case illustrated in FIGS. 3(d) to 3(f), and thus this can result in erroneous determination.

A difference between the normal case illustrated in FIGS. 3(a) to 3(c) and the nonsticking case illustrated in FIGS. 3(d) to 3(f) lies between FIG. 3(b) at $t=t_1$ and FIG. 3(e) at $t=t_2$. Therefore, in order to distinguish between the normal case illustrated in FIGS. 3(a) to 3(c) and the nonsticking case illustrated in FIGS. 3(d) to 3(f) by the nonsticking determination circuit 36, it is necessary to determine whether or not the wire 30 is disconnected between $t=t_1$ and $t=t_2$. As $t=t_1$ and $t=t_2$ are influenced by a shape of the loop and a speed of cutting, $t=t_1$ and $t=t_2$ change every time when parameters for wire bonding changes. If a period between $t=t_1$ and $t=t_2$ is sufficiently long, the nonsticking determination circuit 36 is able to distinguish between the case in FIGS. 3(a) to 3(c) and the case in FIGS. 3(d) to 3(f). However, if the period between $t=t_1$ and $t=t_2$ is short, it is highly probable that the nonsticking determination circuit 36 makes erroneous determination in distinguishing between the two cases.

Figure 4:
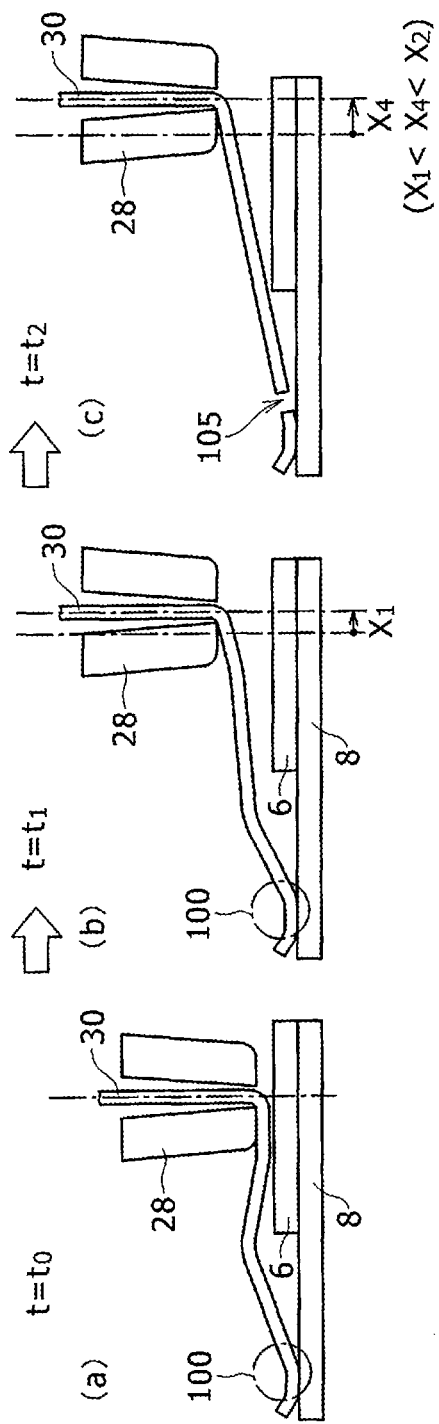
FIG. 4 illustrates that the erroneous determination in FIG. 3 easily occurs when a short and low loop is formed in wire bonding.

FIG. 4 illustrates a case in which as conditions for wire bonding, a distance between the first bonding point 100 and the second bonding point 102 is short, a height of a loop formed therebetween is low, and a length of the loop is short. If a short and low loop is formed in this manner, the wire 30 is likely to be disconnected early when the state is nonsticking at the second bonding point 102, and there is no difference between $t=t_1$ and $t=t_2$ in FIG. 3. Thus, it becomes highly probable that these two cases are erroneously determined.

FIG. 4(a) illustrates a state in which the capillary 28 is slightly moved upward to the +Z direction after the second wire bonding at timing slightly earlier than $t=t_0$ in FIG. 3(d). Here, the state is nonsticking at the second bonding point 102. FIG. 4(b) illustrates a state in which the capillary 28 is slightly moved upward from the state in FIG. 4(a) to the +Z direction by $X_1$ at $t=t_1$, and the wire 30 is not yet disconnected. FIG. 4(c) illustrates a state in which the capillary 28 has moved to the +X direction by $X_4$ at $t=t_2$, and here the wire 30 is brought into the disconnected state 105 between the first bonding point 100 and the second bonding point 102. As FIG. 4 shows the case in which a short and low loop is formed, time $t_2$, $X_4$ in FIG. 4(c) is shorter than and takes a value smaller than time $t_2$, $X_2$ in FIG. 3(e), and the wire 30 is disconnected at earlier timing.

Figure 5:
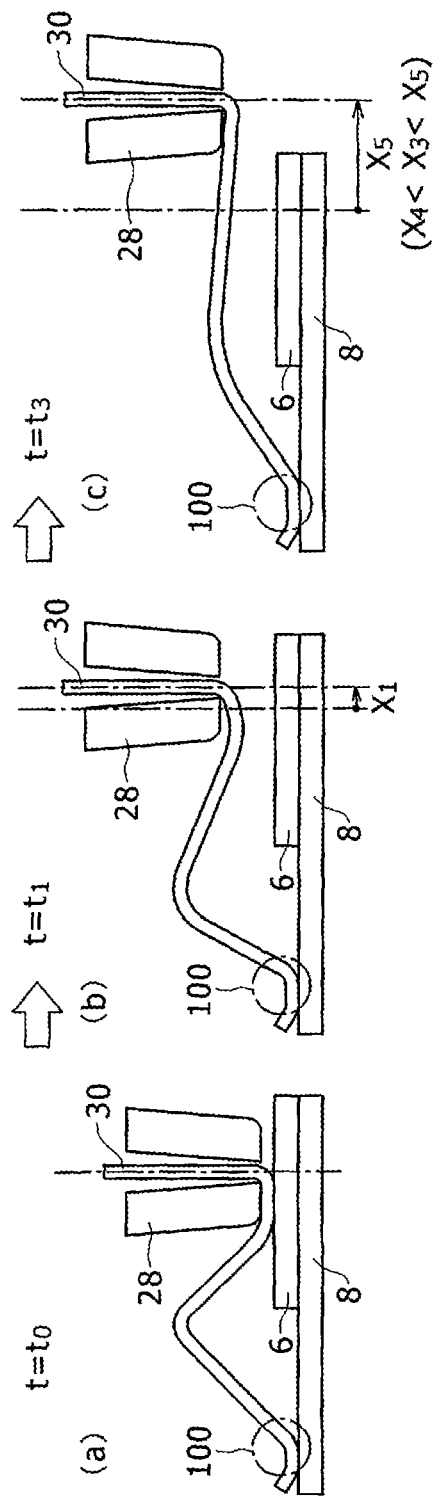
FIG. 5 illustrates that the erroneous determination in FIG. 3 does not easily occur when a long and high loop is formed in wire bonding as compared to FIG. 4.

FIG. 5 illustrates a case in which as the conditions for wire bonding, the distance between the first bonding point 100 and the second bonding point 102 is long, the height of the loop formed therebetween is high, and the length of the loop is long. If a long and high loop is formed in this manner, there is time before disconnection of the wire 30 even when the state is nonsticking at the second bonding point 102, and the period between $t=t_1$ and $t=t_2$ in FIG. 3 becomes longer. Thus, it becomes less likely that these two cases are erroneously determined.

FIG. 5(a) illustrates a state in which the capillary 28 is slightly moved upward to the +Z direction after the second wire bonding at $t=t_0$ similarly to FIG. 4(a). Similarly, here, the state is nonsticking at the second bonding point 102. FIG. 5(b) illustrates a state similarly to FIG. 4(b) in which the capillary 28 is slightly moved upward from the state in FIG. 5(a) to the +Z direction and has moved in the X direction by $X_1$ at $t=t_1$. The loop formed here is higher than that in FIG. 4(b). At this time, the wire 30 is not yet disconnected. FIG. 5(c) illustrates a state in which the capillary 28 has moved to the +X direction by $X_5$ at $t=t_3$. Here, $X=X_5$ is larger than $X=X_3$ at $t=t_3$ in FIGS. 3(c) and 3(f), and $t=t_3$, $X=X_5$ is longer than and takes a value larger than $t=t_2$, $X=X_4$ in FIG. 4(c). The wire 30 is not yet disconnected here too. If a long and high loop is formed in this manner, there is time before disconnection of the wire 30 even when the state is nonsticking at the second bonding point 102, and it becomes less likely that these two cases are erroneously determined. It should be noted that a relation between the movement distances to the +X direction illustrated in FIG. 3 through FIG. 5 is $X_1 < X_4 < X_2 < X_3 < X_5$.

As described above, it becomes more difficult for the nonsticking determination circuit 36 to distinguish the two cases as the loop is shorter and lower. The two cases are correctly distinguished by the projecting length determination circuit 38 and the projecting length detection ring 40.

When the wire 30 is disconnected at the second bonding point 102, a projecting length of the wire 30 projecting from the tip of the capillary 28 becomes short, taking an appropriate value. By contrast, when the wire 30 is disconnected between the first bonding point 100 and the second bonding point 102, the projecting length of the wire 30 projecting from the tip of the capillary 28 becomes long, taking an inappropriate value. The projecting length determination circuit 38 and the projecting length detection ring 40 determine whether or not the projecting length of the wire 30 projecting from the tip of the capillary 28 is appropriate, and thereby distinguishes between the two cases that the nonsticking determination circuit 36 is not able to distinguish.

Figure 6:
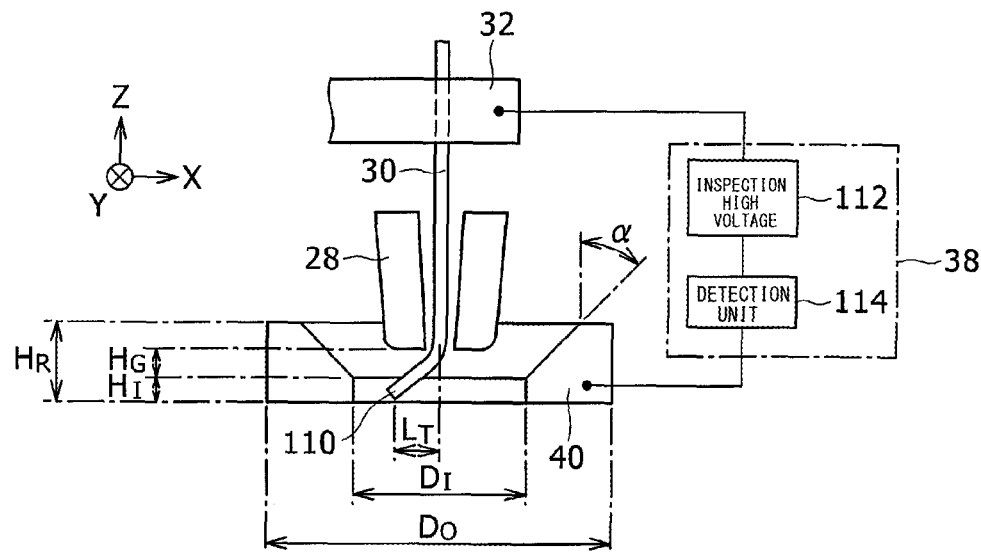
FIG. 6 is a diagram illustrating a projecting length determination circuit of the wire-bonding apparatus according to the embodiment of the present invention.

FIG. 6 is a diagram illustrating a configuration of the projecting length determination circuit 38 and the projecting length detection ring 40. In the figure, a projecting length $L_T$ of a wire tail 110 projecting from the capillary 28 is shown.

The projecting length detection ring 40 attached to the bonding head 18 is an annular member provided coaxially with the capillary 28. An annular opening of the projecting length detection ring 40 is in a shape such that an inner diameter is initially constant and then gradually increases from a −Z direction to the +Z direction, that is, upward from the bonding stage 14, like an inverted triangle. Describing using reference numerals in FIG. 6, an outer diameter of the projecting length detection ring 40 is $D_O$, and a height of the projecting length detection ring 40 as a size in the Z direction is $H_R$. Further, an inner diameter of a portion from a bottom surface that is an end to the −Z direction to a height $H_I$ is $D_I$, and the inner diameter gradually increases toward the upper surface with a slope at an angle $\alpha$.

One example of the dimensions of the projecting length detection ring 40 is as follows: the outer diameter $D_O$ is about 4 mm, the total height $H_R$ is about 1 mm, the height of the uniform inner diameter portion $H_I$ is about 0.2 mm, the uniform inner diameter $D_I$ is about 2.5 mm, and the angle $\alpha$ is about 45 degrees. As the projecting length detection ring 40 configured in this manner, it is possible to use an appropriate metallic material processed in a predetermined shape.

As the projecting length detection ring 40 can be attached to the bonding head 18, it moves along with the capillary 28 within the XY plane, but positioned statically with respect to the movement of the capillary 28 in the Z direction. Specifically, a center axis of the annular opening of the projecting length detection ring 40 is positioned so as to match the axis of the capillary 28 along the longitudinal direction, and the capillary 28 moves in the Z direction along the center axis of the annular opening of the projecting length detection ring 40. When wire bonding is performed at the first bonding point 100 and the second bonding point 102, the tip of the capillary 28 is on a side of the −Z direction as compared to the bottom surface of the projecting length detection ring 40.

When the projecting length is determined, the capillary 28 is moved upward to the +Z direction. In FIG. 6, the tip of the capillary 28 when the projecting length is determined is shown at a position of a height $H_G$ from an upper end of the uniform inner diameter $D_I$ portion of the projecting length detection ring 40. The height $H_G$ is set such that an extending end of the wire tail 110 of the wire 30 projecting from the tip of the capillary 28 is within a range of the height $H_I$ of the uniform inner diameter $D_I$ portion of the projecting length detection ring 40. By setting the height $H_G$ in this manner, it is possible to detect whether or not there is a discharge spark between the projecting length detection ring 40 and the wire tail 110.

The projecting length determination circuit 38 determines whether or not the projecting length $L_T$ of the wire tail 110 projecting from the top of the capillary 28 is appropriate, based on the detection on presence of power conduction when a predetermined inspection voltage is applied between the projecting length detection ring 40 and the wire 30, and based on the detection on whether or not there is a discharge spark when a predetermined inspection high voltage is applied between the projecting length detection ring 40 and the wire 30. The projecting length determination circuit 38 is configured by an inspection high voltage 112 and a detection unit 114, and having one terminal connected to the projecting length detection ring 40 and the other terminal connected to the wire clamper 32. The inspection high voltage 112 is a direct voltage, and the detection unit 114 detects a current value.

When the projecting length $L_T$ of the wire tail 110 is short, there is no discharge spark produced between the projecting length detection ring 40 and the wire tail 110, and the detection unit 114 is not able to detect a current value. When the projecting length $L_T$ of the wire tail 110 is an appropriate length, a discharge spark is produced between the projecting length detection ring 40 and the wire tail 110. Therefore, the detection unit 114 detects a sudden pulsed current value. When the projecting length $L_T$ of the wire tail 110 is too long to be brought into contact with the projecting length detection ring 40, the wire tail 110 is electrically conducted with the projecting length detection ring 40, and the detection unit 114 detects power conduction. In this manner, it is possible to determine the length of the projecting length $L_T$ of the wire tail 110 based on the current value detected by the detection unit 114.

In order to distinguish the case in which the second wire bonding is normally performed and the wire 30 is disconnected at the second bonding point 102 as illustrated in FIGS. 3(a) to 3(c) from the case in which the second wire bonding is inappropriate, and the wire 30 is left nonsticking at the second bonding point 102 and disconnected between the first bonding point 100 and the second bonding point 102 as illustrated in FIGS. 3(d) to 3(f), the inspection high voltage 112 can be set such that taking the projecting length $L_T$ of the wire tail 110 in the normal case shown in FIG. 3(c) as an appropriate projecting length, no spark discharge is produced in the normal case, and a spark discharge is produced when the projecting length $L_T$ exceeds the appropriate projecting length. If one wire bonding step is normally completed, the projecting length $L_T$ of the wire tail 110 projecting from the tip of the capillary 28 is constant. By contrast, if one wire bonding step is abnormally performed, the projecting length $L_T$ of the wire tail 110 projecting from the tip of the capillary 28 varies, generally longer than the projecting length $L_T$ of the wire tail 110 in the normal case.

Figure 7:
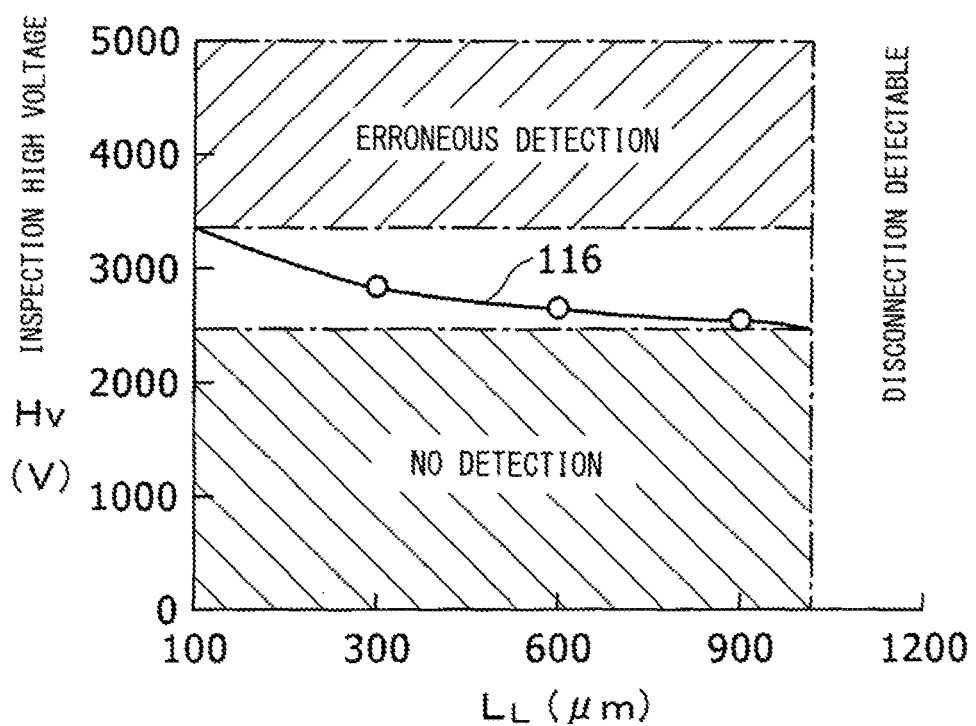
FIG. 7 is a chart showing a relation regarding detection between a projecting length of a wire, an inspection high voltage, and presence of a spark in the wire-bonding apparatus according to the embodiment of the present invention.

FIG. 7 is a chart showing a relation between an inspection high voltage producing a spark discharge and a wire length $L_L$. In FIG. 7, a horizontal axis indicates the wire length $L_L$, and a vertical axis indicates an inspection high voltage $H_V$. The inspection high voltage producing a spark discharge is indicated by a characteristic line 116. As indicated by the characteristic line 116, the inspection high voltage $H_V$ required to produce a spark discharge increases when the wire length $L_L$ becomes shorter, and the inspection high voltage $H_V$ required to produce a spark discharge decreases when the wire length $L_L$ becomes longer.

Therefore, when the inspection high voltage $H_V$ corresponding to the wire length $L_L$ is obtained using the characteristic line 116, and set as the inspection high voltage 112 of the projecting length determination circuit 38, the projecting length $L_T$ is considered to be appropriate and in the normal state shown in FIG. 3(c) if no spark discharge is produced. On the contrary, if a spark discharge is produced with the inspection high voltage 112 thus set, it is possible to determine that the projecting length $L_T$ is inappropriate and the wire 30 is disconnected between the first bonding point 100 and the second bonding point 102.

It should be noted that if the inspection high voltage $H_V$ is too high, a spark discharge is produced even when the projecting length $L_T$ is an appropriate length. In other words, at this inspection high voltage, the detection on whether or not the projecting length is appropriate is erroneously made. Taking this as a region in which erroneous detection is made, the region in which erroneous detection is made in the example shown in FIG. 7 is a case in which $H_V$ is more than or even equal to 3300 V.

If the inspection high voltage $H_V$ is too low, no spark discharge is produced even when the projecting length $L_T$ exceeds an appropriate length. In other words, at this inspection high voltage, it is not possible to detect whether or not the projecting length is appropriate. Taking this as a region in which detection is not made, the region in which detection is not made in the example shown in FIG. 7 is a case in which $H_V$ is less than or equal to 2400 V.

A region shown to be able to detect the disconnection in FIG. 7 is a case in which the wire length $L_L$ is sufficiently long. When the wire length $L_L$ is sufficiently long, the shape of a loop formed between the first bonding point 100 and the second bonding point 102 is loose, and there is time before the wire 30 is disconnected by being pulled even if the wire 30 is nonsticking at the second bonding point 102. Therefore, the nonsticking determination circuit 36 is able to determine the nonsticking state at the second bonding point 102 before the wire 30 is disconnected. In the example shown in FIG. 7, the region in which the disconnection is detectable is a region in which the wire length $L_L$ is more than 1000 μm.

The characteristic line 116 is a characteristic line connecting the values of the inspection high voltage at which no spark discharge is produced when the projecting length is appropriate but a spark discharge is produced when the projecting length exceeds an appropriate value, within the region in which a spark discharge is produced depending on the projecting length $L_T$ of the wire tail 110 surrounded by the region in which the detection is erroneously made, the region in which the detection is not made, and the region in which the disconnection is detectable.

Referring back to FIG. 1, the computer 60 controls operations of the components of the wire-bonding apparatus 10 as a whole. The computer 60 includes a controller 80 as a CPU, the controller 80, various interface circuits, and a memory 82. These components are connected with each other via an internal bus.

The various interface circuits are drive circuits or buffer circuits provided between the controller 80 as a CPU and the respective components of the wire-bonding apparatus 10. In FIG. 1, the interface circuits are simply referred to as I/Fs. The various interface circuits include an XY stage I/F 62 connected to the XY stage 16, a Z motor I/F 64 connected to the Z motor 20, an ultrasonic transducer unit I/F 66 connected to the ultrasonic transducer unit 26, a clamper open/close I/F 68 connected to the clamper opening/closing unit 34, a disconnection circuit I/F 70 connected to the nonsticking determination circuit 36 functioning as a disconnection determination circuit, and a projecting length determination circuit I/F 72 connected to the projecting length determination circuit 38.

The memory 82 is a storage device that stores various programs and various control data. The various programs include a first bonding program 84 relating to first wire bonding, a second bonding program 86 relating to second wire bonding, a movement processing program 88 relating to a capillary moving operation for disconnecting the wire, a disconnection determination program 90 relating to a determination operation of disconnection of the wire 30, a projecting length determination program 92 relating to a determination operation of the projecting length of the wire 30, an abnormality output program 94 relating to an abnormal output operation indicating that the wire is abnormally disconnected, a preliminary bonding program 95 relating to preliminary bonding for the next step when an abnormal output is made, and a control program 96 relating to other control operations. Examples of control data 98 include data related to the projecting length of the wire, the inspection high voltage, and the detection related to the presence of a spark described with reference to FIG. 7.

Figure 8:
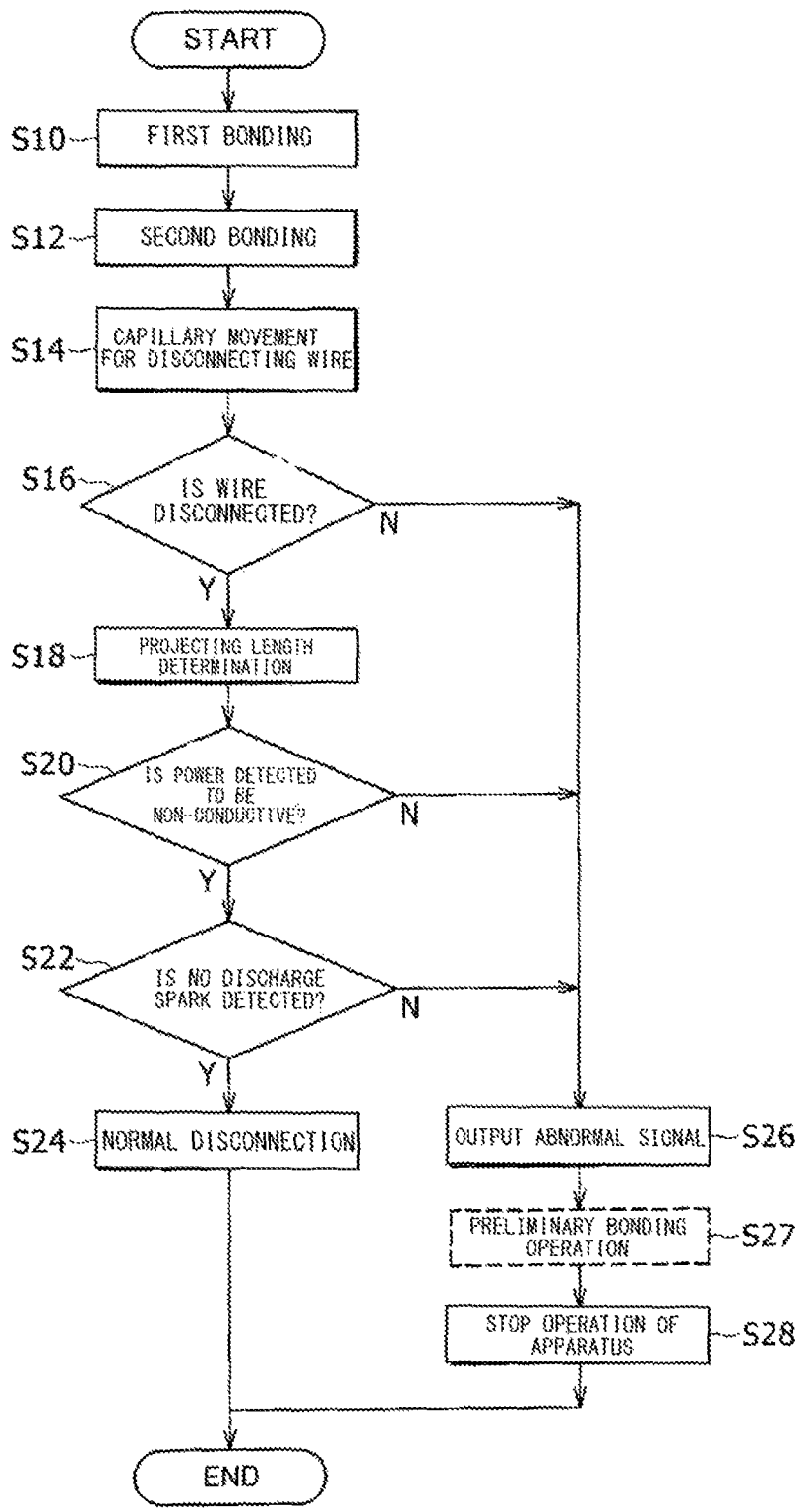
FIG. 8 is a flowchart showing steps of wire bonding as a method of manufacturing a semiconductor device according to the embodiment of the present invention.
Figure 9:
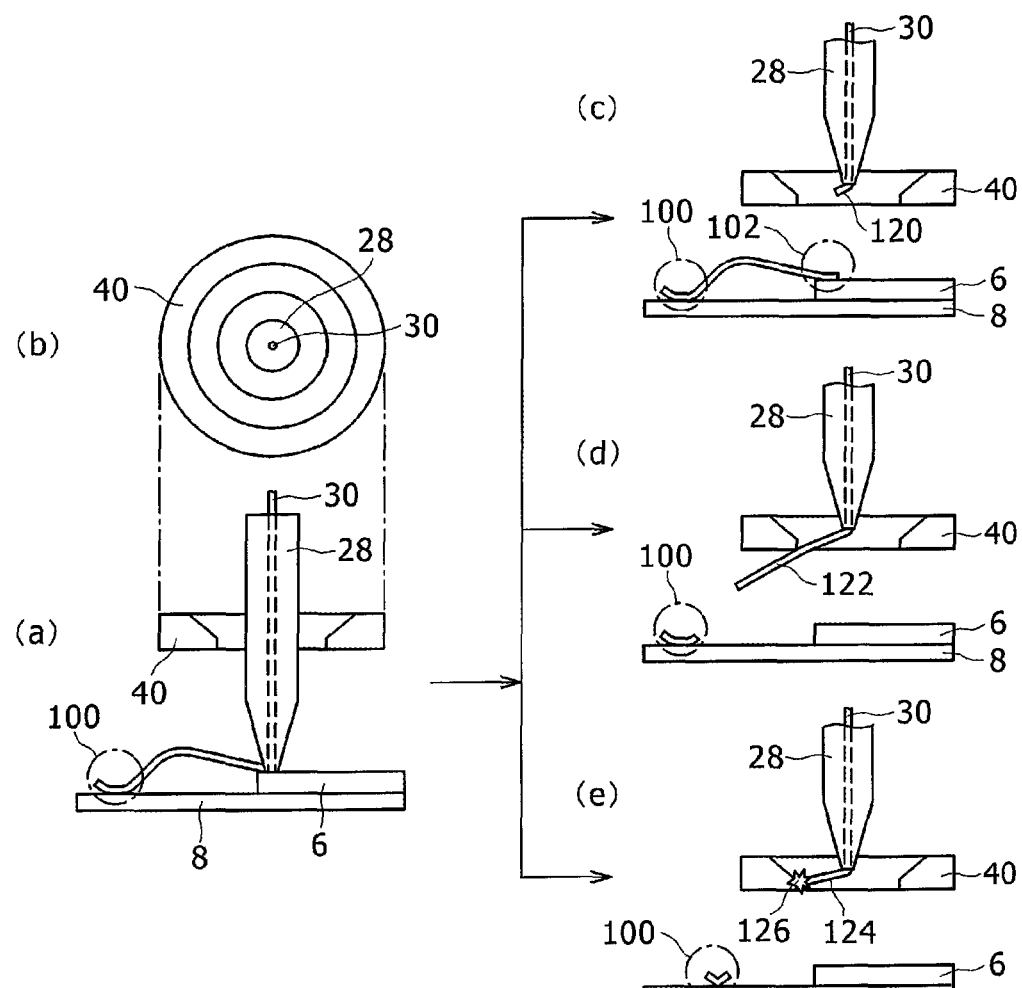
FIG. 9 is a view illustrating that nonsticking determination for a second bonding point is performed by three steps including determination of disconnection of a wire, detection on whether or not power is conducting, and detection on whether or not a discharge spark is present in the flowchart of FIG. 8.
Figure 10:
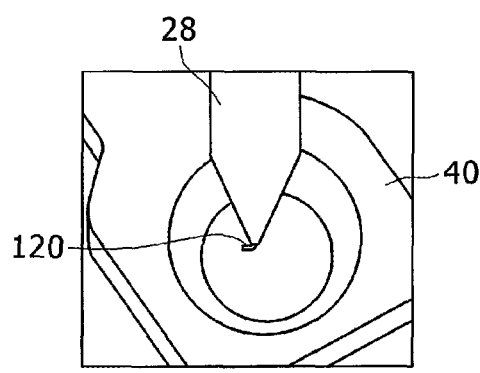
FIG. 10 is a view illustrating that no discharge spark is produced when wire bonding at the second bonding point is normal in the flowchart of FIG. 8.
Figure 11:
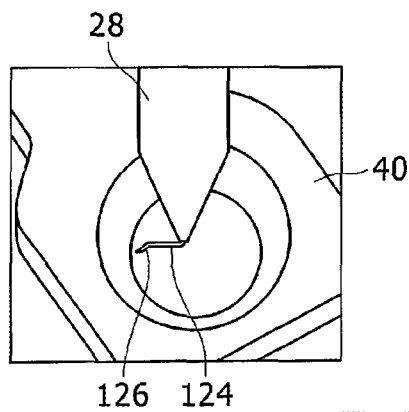
FIG. 11 is a view illustrating that a discharge spark is produced when the projecting length of the wire is not appropriate in the flowchart of FIG. 8.

Effects of the above configuration, in particular, functions of the computer 60 will be described in further detail with reference to FIG. 8 and the following figures. FIG. 8 is a flowchart showing the steps of wire bonding as a method of manufacturing a semiconductor device. FIG. 9 illustrates three steps of determination in the flowchart of FIG. 8. FIG. 10 and FIG. 11 respectively illustrate a case in which a discharge spark is not produced and a case in which a discharge spark is produced, in the projecting length detection ring 40.

FIG. 8 is the flowchart showing the steps of wire bonding, and the steps correspond respectively to processing steps of the programs stored in the memory 82 of the computer 60. When the wire-bonding apparatus 10 is turned on, the components of the wire-bonding apparatus 10 including the computer 60 are initialized.

Next, the bonding stage 14 is pulled out once, and the circuit board 8 having the chip 6 mounted thereon as a bonding target positioned and placed on the bonding stage 14 and then pressed and fixed by the lead clamper 50. Then, the bonding stage 14 is moved back to an initial position. It should be noted that the bonding stage 14 is heated up to a predetermined temperature determined based on the bonding conditions. The bonding target setting step is automatically performed using of an automated carrier device of the circuit board 8.

Thereafter, the first bonding program 84 is executed by the controller 80, and the first wire bonding is performed at the first bonding point 100 (S10). In the first wire bonding, first, the wire 30 is inserted through the capillary 28 in a state in which the wire clamper 32 is open, and the wire 30 projects at the tip of the capillary 28. Then, in response to a command from the controller 80 via the XY stage I/F 62 and the Z motor I/F 64, the XY stage 16 and the Z motor 20 are driven to move, and the capillary 28 with the wire 30 projecting at its tip is moved toward the first bonding point 100. The first bonding point 100 is set on one of the leads of the circuit board 8. The first bonding point 100 is set using a positioning camera or the like that is not illustrated in FIG. 1.

At the first bonding point 100, the wire 30 is sandwiched and pressed between a portion of the tip of the capillary 28 and the lead of the circuit board 8, and the ultrasonic transducer unit 26 is actuated in response to a command from the controller 80 via the ultrasonic transducer unit I/F 66 to bond the wire 30 to the lead by the ultrasonic vibration energy by the transducer unit, a pressing force of the capillary 28 by the Z motor 20 being controlled to drive, and a heating temperature from the bonding stage 14. In this manner, the first wire bonding at the first bonding point 100 is performed.

After the first wire bonding is completed, the loop forming operation is performed. Specifically, after the first wire bonding is completed, the capillary 28 is moved upward while the wire clamper 32 is open, and then moved immediately above the second bonding point 102. The second bonding point 102 is set on one of the pads of the chip 6. During the movement of the capillary 28, the wire 30 is fed from the wire spool 33 and extends from the tip of the capillary 28 by a required length. The movement of the capillary 28 is performed by the XY stage 16 and the Z motor 20 being driven to move in response to a command from the controller 80.

After the loop forming operation, the second wire bonding is performed (S12). This step is performed by the controller 80 executing the second bonding program 86. By including the loop formation step in the second bonding program 86, the second wire bonding can include the loop forming operation.

At the second bonding point 102, similarly to the first wire bonding, the wire 30 is sandwiched and pressed between the portion of the tip of the capillary 28 and the pad of the chip 6, and the ultrasonic transducer unit 26 is actuated in response to a command from the controller 80 via the ultrasonic transducer unit I/F 66 to bond the wire 30 to the pad by the ultrasonic vibration energy by the transducer unit, the pressing force of the capillary 28 by the Z motor 20 being controlled to drive, and a heating temperature from the bonding stage 14. In this manner, the second wire bonding at the second bonding point 102 is performed.

After the second wire bonding is completed, the moving operation for disconnecting the wire is performed (S14). This step is performed by the controller 80 executing the movement processing program 88. The moving operation for disconnecting the wire disconnection is performed in the following steps.

After bonding at the second bonding point 102 is performed, the Z motor 20 is controlled to rotate in response to a command from the controller 80 via the Z motor I/F 64 to slightly move the capillary 28 upward. Next, the XY stage 16 is driven to move in response to a command from the controller 80 via the XY stage I/F 62, and the wire tail is pulled obliquely upward. Further, a command from the controller 80 is supplied to the clamper opening/closing unit 34 via the clamper open/close I/F 68 to close the wire clamper 32, and the XY stage 16 is driven to move in this state via the XY stage I/F 62. Thus, the capillary 28 is moved within the XY plane.

In other words, the wire 30 is pulled within the XY plane while the wire clamper 32 clamps the wire 30. As conditions for the second wire bonding are set so that bonding strength at the second bonding point 102 is sufficiently greater than bond shear strength of the wire 30, the wire 30 is disconnected at the second bonding point 102.

After the operation of moving the capillary 28 to disconnect the wire is completed, the determination on whether or not the wire is disconnected is made (S16). This step is performed by the controller 80 executing the disconnection determination program 90. The determination on whether or not the wire is disconnected is made by actuating the nonsticking determination circuit 36 in response to a command from the controller 80 via the disconnection determination circuit I/F 70, and the controller 80 receiving the result from the nonsticking determination circuit 36. When the wire 30 is not determined to be disconnected in S16, it is determined that the wire is nonsticking at the second bonding point 102, and an abnormal signal is output a (S26). Even when the wire 30 is determined to be disconnected in S16, if that bonding is normally performed at the second bonding point 102, there is a possibility that the determination has been erroneously made as described with reference to FIG. 3.

Therefore, in S16 for determining the disconnection of the wire, after the wire 30 is determined to be disconnected, the projecting length $L_T$ of the wire tail 110 projecting from the tip of the capillary 28 is determined (S18). The determination of the projecting length $L_T$ is made using the projecting length determination circuit 38 and the projecting length detection ring 40. The determination of the projecting length $L_T$ is performed by two steps of whether or not the power conduction in which the wire tail 110 projecting from the tip of the capillary 28 is brought into contact with the projecting length detection ring 40 is detected (S20), and whether or not a discharge spark is detected under the predetermined inspection high voltage when the power conduction has not been detected (S22). These steps are performed by the controller 80 executing the projecting length determination program.

As described above, the nonsticking determination at the second bonding point 102 is performed by the three steps of determination in S16, S20, and S22. When the wire 30 has been determined to be disconnected in S16, when the power conduction has not been determined to be detected in S20, and when the discharge spark has not determined to be detected in S22, it is determined that the second wire bonding is normally performed at the second bonding point 102 and that the wire 30 is normally disconnected at the second bonding point 102 (S24).

In contrast, when the wire 30 has not been determined to be disconnected in S16, it is determined that the wire 30 is nonsticking at the second bonding point 102 and that the wire 30 is not disconnected. If the determination in S16 is affirmative and the power conduction has been detected in S20, it is determined that the wire is nonsticking at the second bonding point 102, that the wire 30 is disconnected between the first bonding point 100 and the second bonding point 102, and that the projecting length of the wire tail 110 from the capillary 28 is overly long beyond an appropriate projecting length. If the determination in S20 is affirmative and the discharge spark has been detected in S22, it is determined that the projecting length $L_T$ of the wire tail 110 from the capillary 28 exceeds an appropriate projecting length. In any of these cases, an abnormal signal is output (S26) and the operation of the wire-bonding apparatus 10 is stopped (S28). These steps are performed by the controller 80 executing the abnormality output program 94.

The three steps of the determination of nonstickingness at the second bonding point 102 are illustrated in FIG. 9. FIGS. 9(a) and 9(b) respectively show a sectional view and a plane view, both illustrating a positional relation between the capillary 28 and the projecting length detection ring 40 when the second wire bonding is performed.

FIG. 9(c) illustrates a case in which bonding at the second bonding point 102 is normally performed and the wire 30 is disconnected normally at the second bonding point 102, the case corresponding to the case in which the determination in S16 of FIG. 8 is affirmative. In this case, when a projecting length of a wire tail 120 projecting from the tip of the capillary 28 is appropriate, and when a predetermined inspection high voltage is applied between the wire 30 and the projecting length detection ring 40 in the wire clamper 32, no discharge spark is produced between the wire tail 120 projecting from the tip of the capillary 28 and the projecting length detection ring 40.

FIG. 9(d) illustrates a case in which the wire 30 is nonsticking at the second bonding point 102, the wire 30 is disconnected between the first bonding point 100 and the second bonding point 102, and the projecting length $L_T$ of a wire tail 122 projecting from the tip of the capillary 28 is too long. In this case, the wire tail 122 projecting from the tip of the capillary 28 is brought into contact with the projecting length detection ring 40, and the projecting length determination circuit 38 has detected the power conduction. This case corresponds to the case in which the determination in S20 of FIG. 8 is negative.

FIG. 9(e) illustrates a case in which the wire 30 is nonsticking at the second bonding point 102, the wire 30 is disconnected between the first bonding point 100 and the second bonding point 102, and the projecting length $L_T$ of a wire tail 124 projecting from the tip of the capillary 28 exceeds an appropriate projecting length that has been previously determined. In this case, when a predetermined inspection high voltage is applied between the wire 30 and the projecting length detection ring 40 in the wire clamper 32, a discharge spark is produced between the wire tail 124 projecting from the tip of the capillary 28 and the projecting length detection ring 40. Specifically, this case corresponds to the case in which the projecting length determination circuit 38 detects a discharge spark, and in which the determination in S22 of FIG. 9 is negative.

FIG. 10 and FIG. 11 illustrate examples in which a discharge is produced and not produced between the wire tail projecting from the tip of the capillary 28 and the projecting length detection ring 40 when a predetermined inspection high voltage is set by the projecting length determination circuit 38. The predetermined inspection high voltage is set such that no discharge spark is produced at the projecting length $L_T$ of the wire tail within a range of the appropriate projecting length previously determined based on various setting conditions such as the wire length between the first bonding point 100 and the second bonding point 102 in wire bonding and the diameter of the wire, and that a discharge spark is produced at the projecting length $L_T$ exceeding an appropriate projecting length.

FIG. 10 corresponds to the case of FIG. 9(c) in which the projecting length $L_T$ of the wire tail 120 projecting from the tip of the capillary 28 is appropriate, and no discharge spark is produced between the wire tail 120 projecting from the tip of the capillary 28 and the projecting length detection ring 40.

FIG. 11 corresponds to the case of FIG. 9(e) in which the projecting length $L_T$ of the wire tail 124 projecting from the tip of the capillary 28 exceeds an appropriate projecting length corresponding to the inspection high voltage, and a discharge spark 126 is produced between the wire tail 124 projecting from the tip of the capillary 28 and the projecting length detection ring 40.

As described above, using the projecting length detection ring 40 and the projecting length determination circuit 38 along with the nonsticking determination circuit 36, it is possible to determine correctly whether or not the state is nonsticking at the second bonding point 102 even when an aluminum wire having an expanding property smaller than a gold wire is used in wedge bonding by the capillary 28.

In the above description, when an abnormal signal is output in S26, the operation of the wire-bonding apparatus 10 is stopped in S28. When an abnormal signal is output, the projecting length $L_T$ of the wire tail projecting from the tip of the capillary 28 is inappropriate. Therefore, it is preferable to perform preliminary bonding (S27) between S26 and S28, to make the projecting length of the wire 30 appropriate. The preliminary bonding is performed by the controller 80 executing the preliminary bonding program 95. In the preliminary bonding, a lead having an appropriate area out of the leads of the circuit board 8 can be used as a lead for preliminary bonding, and a portion or a position of the chip 6 for preliminary bonding is not particularly limited as long as the portion or the position does not give any real harm to a product. In the following description, a case in which the projecting length $L_T$ of the wire tail 122 in FIG. 9(d) is made appropriate will be described as one example of the preliminary bonding.

Figure 12:
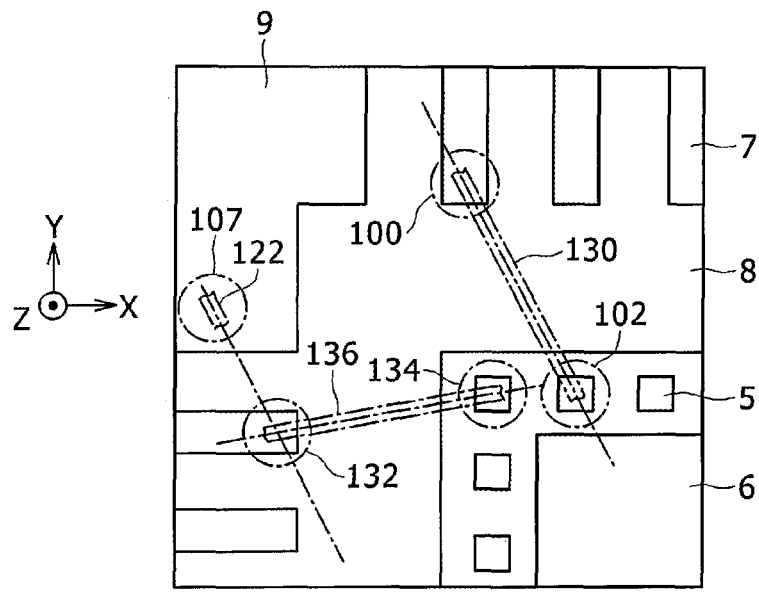
FIG. 12 is a view illustrating that preliminary bonding is performed at a preliminary bonding point in the wire-bonding apparatus according to the embodiment of the present invention.

FIG. 12 is a partial view of the bonding stage 14 viewing from a side of the capillary 28 to the −Z direction, illustrating that preliminary bonding is performed between the first wire bonding and the second wire bonding. In the figure, five leads 7 of the circuit board 8, a lead 9 used for preliminary bonding, and five pads 5 of the chip 6 are shown.

Here, the wire bonding to be first performed is to connect the first bonding point 100 provided for one of the leads 7 of the circuit board 8 and the second bonding point 102 provided for one of the pads 5 of the chip 6 with a wire 130. The wire bonding to be second performed is to connect a first bonding point 132 provided for one of the leads 7 of the circuit board 8 and a second bonding point 134 provided for one of the pads 5 of the chip 6 with a wire 136. A connecting direction of the wire 130 and a connecting direction of the wire 136 make an angle of 70 degrees with each other.

A preliminary bonding point 107 provided for the lead 9 is at a position for preliminary bonding to allow smooth transition to the second wire bonding even when the projecting length $L_T$ of the wire tail 122 of the wire 130 projecting from the capillary 28 at the second bonding point 102 in the first wire bonding is not appropriate. Preliminary bonding is performed after the first wire bonding at the second bonding point 102 is completed and before the second wire bonding at the first bonding point 132 is started.

Specifically, in FIG. 8, upon outputting of an abnormal signal (S26), preliminary bonding is performed (S27). This step is performed by the controller 80 executing the preliminary bonding program 95. The preliminary bonding is performed in the following manner by moving the capillary 28 via the XY stage I/F 62 and the Z motor I/F 64, opening/closing the wire clamper 32 via the clamper open/close I/F 68, and actuating the ultrasonic transducer unit 26 via the ultrasonic transducer unit I/F 66.

Figure 13:
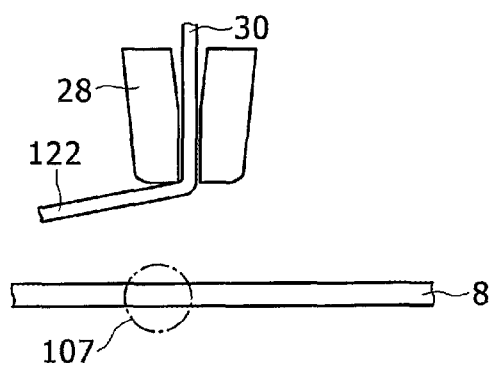
FIG. 13 is a view illustrating that a capillary is moved immediately above the preliminary bonding point.

The capillary 28 is moved immediately above the preliminary bonding point 107 provided for the lead 9 for preliminary bonding while the wire 30 having the wire tail 122 projecting from the tip of the capillary 28 is held. FIG. 13 is a diagram illustrating that the capillary 28 is moved immediately above the preliminary bonding point 107 of the circuit board 8.

Figure 14:
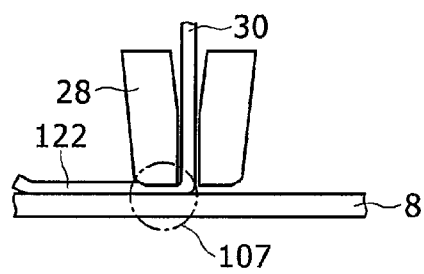
FIG. 14 is a view illustrating that the preliminary bonding is performed after the state shown in FIG. 13.

Next, the capillary 28 is moved down to the −Z direction while the wire tail 122 is held at the tip to perform wire bonding at the preliminary bonding point 107. Specifically, the ultrasonic transducer unit 26 is actuated in response to a command from the controller 80 via the ultrasonic transducer unit I/F 66 to bond the wire tail 122 to the lead 9 of the circuit board 8 by the ultrasonic vibration energy by the transducer unit and the pressing force of the capillary 28 by the Z motor 20 being controlled to drive, as well as by a heating temperature from the bonding stage 14 if necessary. FIG. 14 is a view illustrating that the wire tail 122 is bonded to the circuit board 8 at the preliminary bonding point 107.

After the wire tail 122 and the circuit board 8 bonded at the preliminary bonding point 107, then the capillary 28 is moved immediately upward to the +Z direction from the preliminary bonding point 107 while the wire clamper 32 is closed as an operation of a wire tail movement and a wire cutting movement. As conditions for the preliminary bonding are set such that bonding strength at the preliminary bonding point 107 is sufficiently greater than the bond shear strength of the wire 30, the wire 30 is disconnected at the preliminary bonding point 107. In this manner, the wire 30 is pulled from the preliminary bonding point 107 by moving the capillary 28, and thus the wire 30 is disconnected.

Figure 15:
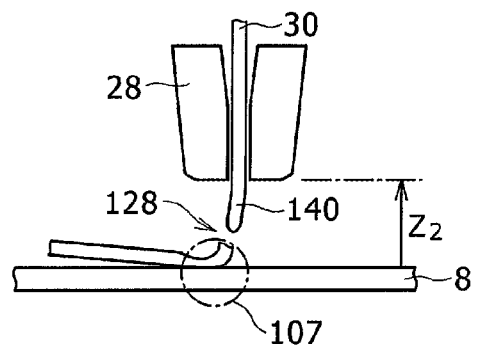
FIG. 15 is a view illustrating that the wire is disconnected at the preliminary bonding point after the state shown in FIG. 14.

FIG. 15 illustrates that, after the state shown in FIG. 14, the capillary 28 is moved in the XY plane by a predetermined distance, and obliquely upward to the +Z direction by $Z_2$, and the wire 30 is in disconnected state 128 at the preliminary bonding point 107. FIG. 15 illustrates a portion left on a side of the preliminary bonding point 107 and a wire tail 140 projecting from the tip of the capillary 28.

As described above, even when the projecting length $L_T$ of the wire tail projecting from the tip of the capillary 28 is inappropriate and an abnormal signal is output, the projecting length $L_T$ of the wire tail projecting from the tip of the capillary 28 can be made appropriate by performing the preliminary bonding to prepare a state appropriate for the next wire bonding. While the preliminary bonding (S27) is described to be performed immediately after an abnormal signal is output in the flowchart in FIG. 8, the preliminary bonding can be performed after the wire-bonding apparatus 10 is stopped (S28). Further, while the operation is described to be finished (END) after the wire-bonding apparatus 10 is stopped (S28) in the flowchart in FIG. 8, it is possible to move to the next wire bonding without stopping the operation.

The present invention is not limited to the embodiment described above, and includes any modifications and alterations without departing from the technical scope and the spirit of the present invention defined by the appended claims.

INDUSTRIAL APPLICABILITY

The present invention can be applied to a wire-bonding apparatus performing wire bonding using a capillary, as well as to a method of wire bonding for performing wire bonding using a capillary.

REFERENCE SIGNS LIST

5: Pad
6: Chip
7, 9: Lead
8: Circuit Board
10: Wire-Bonding Apparatus

12: Mount
14: Bonding Stage
16: XY Stage
18: Bonding Head
20: Z Motor
22: Z-Drive Arm
24: Ultrasonic Transducer
26: Ultrasonic Transducer Unit
28: Capillary
30, 130, 136: Wire
32: Wire Clamper
33: Wire Spool
34: Clamper Opening/Closing Unit
36: Nonsticking Determination Circuit
38: Projecting Length Determination Circuit
40: Projecting Length Detection Ring
50: Lead Clamper
60: Computer
62: XY Stage I/F
64: Z Motor I/F
66: Ultrasonic Transducer Unit I/F
68: Clamper Open/Close I/F
70: Disconnection Determination Circuit I/F
72: Projecting Length Determination Circuit I/F
80: Controller
82: Memory
84: First Bonding Program
86: Second Bonding Program
88: Movement Processing Program
90: Disconnection Determination Program
92: Projecting Length Determination Program
94: Abnormality Output Program
95: Preliminary Bonding Program
96: Control Program
98: Control Data
100, 132: First Bonding Point
102, 134: Second Bonding Point
103, 104, 105, 128: Disconnected State
106: Application Power Source
107: Preliminary Bonding Point
108: Measurement Unit
110, 120, 122, 124, 140: Wire Tail
112: Inspection High Voltage
114: Detection Unit
116: Characteristic Line
126: Discharge Spark

The invention claimed is:

1. A wire bonding apparatus comprising:
a capillary through which a wire is inserted;
an annular wire projecting length detection ring disposed coaxially with the capillary; and
a projecting length determination unit configured to determine whether or not a projecting length of the wire projecting from a tip of the capillary is appropriate based on detection on whether or not power is conductive when a predetermined inspection voltage is applied between the wire and the wire projecting length detection ring.

2. The wire bonding apparatus according to claim 1, Wherein a predetermined inspection high voltage is applied between the wire and the wire projecting length detection ring to detect a presence of a discharge spark, if the power has been detected to be non-conductive when the predetermined inspection voltage is applied between the wire and the wire projecting length detection ring.

3. The wire bonding apparatus according to claim 2, wherein the projecting length determination unit:
previously obtains a relation regarding detection among the projecting length of the wire, the inspection high voltage, and the presence of a spark;
sets the inspection high voltage according to a bonding condition for wire bonding; and
determines whether or not the projecting length of the wire is suitable for the bonding condition.

4. The wire bonding apparatus according to claim 3, further comprising:
a disconnection determination unit configured to apply a predetermined electrical signal and to determine whether or not the wire is disconnected based on a response of the application of the predetermined electrical signal, the predetermined electrical signal being applied between a bonding target and the wire in a clamped state after an operation of disconnecting the wire from a second bonding point is performed by moving the capillary while the wire is in the clamped state after wire bonding at the second bonding point is performed subsequent to wire bonding at a first bonding point, wherein
when the disconnection determination unit has determined that the wire is disconnected, the projecting length determination unit determines whether or not the projecting length of the wire is appropriate, and when the projecting length of the wire has been determined to be inappropriate, outputs an abnormal signal determining that bonding at the second bonding point has not been performed and that the wire has been disconnected between the first bonding point and the second bonding point.

5. The wire bonding apparatus according to claim 4, further comprising:
a preliminary bonding unit configured to, when the projecting length of the wire has been determined to be inappropriate, make a disconnected tip portion of the wire be an appropriate projecting length using a previously determined preliminary bonding point.

6. The wire bonding apparatus according to claim 4, wherein
the wire bonding at the first bonding point and the second bonding point is performed according to a wedge bonding method.

7. A method of manufacturing a semiconductor device, the method comprising:
a first wire bonding step of bonding a wire to a first bonding target at a first bonding point of wire bonding using a capillary through which the wire is inserted, the bonding being performed according to a wedge bonding method;
a second wire bonding step of feeding the wire by a predetermined wire length from the first bonding point after the wire bonding at the first bonding point, and bonding the wire to a second bonding target at a second bonding point of the wire bonding;
a movement step of, after the wire bonding at the second bonding point, moving the capillary through which the wire is inserted while the wire is clamped to disconnect the wire from the second bonding point;
a disconnection determination step of applying a predetermined electrical signal between the second bonding target and the wire after the capillary has been moved to disconnect the wire, and determining whether or not the wire is disconnected based on a response of the application of the predetermined electrical signal;
a projecting length determination step of determining whether or not the projecting length of the wire projecting from the tip of the capillary is appropriate when the wire has been determined to be disconnected, the determination being made based on detection on whether or not power is conductive when a predetermined inspection voltage is applied between the wire and an annular wire projecting length detection ring disposed coaxially with the capillary; and an output step of, when the projecting length of the wire has been determined to be inappropriate, outputting an abnormal signal determining that bonding at the second bonding point has not been performed and that the wire has been disconnected between the first bonding point and the second bonding point.

8. The method of manufacturing a semiconductor device according to claim 7, wherein a predetermined inspection high voltage is applied between the wire and the wire projecting length detection ring to detect a presence of a discharge spark, if the power has been detected to be non-conductive when the predetermined inspection voltage is applied between the wire and the wire projecting length detection ring.

9. The method of manufacturing a semiconductor device according to claim 7, the method further comprising:

a preliminary bonding step of making a disconnected tip portion of the wire be an appropriate projecting length using a previously determined preliminary bonding point when the projecting length of the wire has been determined to be inappropriate.

* * * * *